United States Patent
Taniguchi (10) Patent No.: US 11,984,865 B2
(45) Date of Patent: May 14, 2024

(54) BAND PASS FILTER

(71) Applicant: Murata Manufacturing Co., Ltd., Nagaokakyo (JP)

(72) Inventor: Tetsuo Taniguchi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 171 days.

(21) Appl. No.: 17/857,201

(22) Filed: Jul. 5, 2022

(65) Prior Publication Data

US 2022/0337215 A1    Oct. 20, 2022

Related U.S. Application Data (63) Continuation of application No. PCT/JP2021/001048, filed on Jan. 14, 2021.

(30) Foreign Application Priority Data

Jan. 24, 2020    (JP) .................. 2020-009672

(51) Int. Cl.
*H03H 7/01*    (2006.01)
*H01P 1/203*    (2006.01)
*H03H 7/09*    (2006.01)
*H03H 1/00*    (2006.01)

(52) U.S. Cl.
CPC ....... *H03H 7/0115* (2013.01); *H01P 1/20345* (2013.01); *H03H 7/0161* (2013.01); *H03H 7/09* (2013.01); *H03H 2001/0085* (2013.01)

(58) Field of Classification Search
CPC . H03H 7/0115; H03H 2001/0085; H03H 7/09

USPC ......................................... 333/175, 177, 185
See application file for complete search history.

(56) References Cited

U.S. PATENT DOCUMENTS

| | | | |
|---|---|---|---|
| 3,718,874 A * | 2/1973 | Cooper, Jr. | H03H 7/0161 336/200 |
| 9,722,567 B2 * | 8/2017 | Yunoki | H03H 7/1758 |
| 2013/0229241 A1 | 9/2013 | Imamura | |
| 2014/0077895 A1 | 3/2014 | Imamura | |

(Continued)

FOREIGN PATENT DOCUMENTS

| | | |
|---|---|---|
| EP | 2009787 A1 | 12/2008 |
| JP | 2014057277 A | 3/2014 |
| WO | 2007119356 A1 | 10/2007 |

(Continued)

OTHER PUBLICATIONS

Office Action in JP2021-573107, dated Jun. 6, 2023, 3 pages.

(Continued)

*Primary Examiner* — Rakesh B Patel
(74) *Attorney, Agent, or Firm* — Keating & Bennett, LLP (57) ABSTRACT

A band pass filter includes filter circuits, first and second intermediate circuits, and a first capacitor. The first intermediate circuit includes an inductor connected between second and third capacitors. The second intermediate circuit includes an inductor connected between third and fourth capacitors. Resonant circuits included in the filter circuit are connected to ground via a common capacitor. Resonant circuits included in the filter circuit are connected to the ground via a common capacitor. The first capacitor is connected between the first and second intermediate circuits.

14 Claims, 5 Drawing Sheets

(56) References Cited

U.S. PATENT DOCUMENTS

| | | |
|---|---|---|
| 2019/0260343 A1 | 8/2019 | Shiokawa |
| 2021/0044269 A1 | 2/2021 | Taniguchi |

FOREIGN PATENT DOCUMENTS

| | | |
|---|---|---|
| WO | 2012077498 A1 | 6/2012 |
| WO | 2018092442 A1 | 5/2018 |
| WO | 2019146441 A1 | 8/2019 |

OTHER PUBLICATIONS

International Search Report in PCT/JP2021/001048, dated Mar. 23, 2021, 3 pages.

Written Opinion in PCT/JP2021/001048, dated Mar. 23, 2021, 3 pages.

* cited by examiner

FILTER CHARACTERISTIC DIAGRAM
OF BAND PASS FILTER 100

FILTER CHARACTERISTIC DIAGRAM
OF BAND PASS FILTER 100A

BAND PASS FILTER

CROSS REFERENCE TO RELATED APPLICATIONS

This application claims the benefit of priority to Japanese Patent Application No. 2020-009672 filed on Jan. 24, 2020 and is a Continuation Application of PCT Application No. PCT/JP2021/001048 filed on Jan. 14, 2021. The entire contents of each application are hereby incorporated herein by reference.

BACKGROUND OF THE INVENTION

1. Field of the Invention

The present invention relates to a band pass filter and, more particularly, to a band pass filter that includes a plurality of resonant circuits each including one or more inductors and one or more capacitors.

2. Description of the Related Art

Radio frequency band pass filters suitable for reduction in size and cost are configured such that a plurality of resonant circuits each including one or more capacitors and one or more inductors are formed in a multilayer body including dielectric layers, pattern conductors, and via conductors. An example of such band pass filters includes a band pass filter described in Japanese Unexamined Patent Application Publication No. 2014-57277.

The band pass filter of the Japanese Unexamined Patent Application Publication No. 2014-57277 includes three or more resonant circuits, each including an inductor and a capacitor, and a floating conductor crossing each of the inductors without touching other line conductors. Further, the electrostatic capacitance generated by the floating conductor and one or more predetermined line conductors is made larger than the sum of resonance capacitances of a capacitor.

Regarding band pass filters, in some cases, both the maintenance of a pass band and the change in attenuation of an attenuation pole are needed at the same time. Here, in the band pass filter of the Japanese Unexamined Patent Application Publication No. 2014-57277, by using the configuration described above, a desired pass band is obtained while capacitive coupling is established between resonant circuits that are not adjacent to each other. In such a case, when the pass band is changed, the attenuation of the attenuation pole sometimes changes together with the change of the pass band. That is, there is a possibility that the change in attenuation of an attenuation pole while a pass band is maintained is difficult to achieve.

SUMMARY OF THE INVENTION

Preferred embodiments of the present invention provide band pass filters that each enable an attenuation pole with a desired attenuation to be provided on at least one of a high frequency side and a low frequency side of a pass band while the pass band is maintained.

In a band pass filter according to a preferred embodiment of the present invention, a coupling structure of a plurality of resonant circuits is improved.

A band pass filter according to a preferred embodiment of the present invention includes a first filter circuit, a second filter circuit, a first intermediate circuit, a second intermediate circuit, and a ninth capacitor. The first filter circuit includes a first resonant circuit, a second resonant circuit, and a first common capacitor. The first resonant circuit includes a first inductor, a third inductor, and a first capacitor. The second resonant circuit includes a second inductor, the third inductor, and a second capacitor. The first resonant circuit and the second resonant circuit are connected to ground via the first common capacitor. The second filter circuit includes a third resonant circuit, a fourth resonant circuit, and a first common capacitor. The third resonant circuit includes a fourth inductor, a sixth inductor, and a third capacitor. The fourth resonant circuit includes a fifth inductor, the sixth inductor, and a fourth capacitor. The third resonant circuit and the fourth resonant circuit are connected to the ground via the second common capacitor. The first intermediate circuit includes a fifth capacitor connected to the ground, a sixth capacitor connected to the ground, and a seventh inductor connected between the fifth capacitor and the sixth capacitor. The second intermediate circuit includes a seventh capacitor connected to the ground, an eighth capacitor connected to the ground, and an eighth inductor connected between the seventh capacitor and the eighth capacitor. The seventh inductor is electromagnetically coupled with each of the first to third inductors. The eighth inductor is electromagnetically coupled with each of the fourth to seventh inductors. The ninth capacitor is connected between the first intermediate circuit and the second intermediate circuit.

A band pass filter according to a preferred embodiment of the present invention includes a plurality of dielectric layers stacked on top of one another, a first filter circuit, a second filter circuit, a first intermediate circuit, a second intermediate circuit, a first ground electrode, and a first intermediate capacitor electrode. The first filter circuit and the second filter circuit are aligned in a direction orthogonal or substantially orthogonal to a stacking direction of the plurality of dielectric layers. The first intermediate circuit and the second intermediate circuit provided between the first filter circuit and the second filter circuit. The first intermediate circuit is electromagnetically coupled with the first filter circuit. The second intermediate circuit is electromagnetically coupled with each of the second filter circuit and the first intermediate circuit. Each of the first filter circuit and the second filter circuit includes a first line electrode, a common electrode, a first capacitor electrode, a second capacitor electrode, a first via conductor, a second via conductor, and a common via conductor. The first line electrode extends in a vertical direction to the stacking direction of the dielectric layers. The first capacitor electrode and the second capacitor electrode face the common electrode. The first via conductor passes through in the stacking direction and connects the first line electrode and the first capacitor electrode. The second via conductor passes through in the stacking direction and connects the first line electrode and the second capacitor electrode. The common via conductor is between the first via conductor and the second via conductor, passes through in the stacking direction, and connects the first line electrode and the common electrode. Each of the first intermediate circuit and the second intermediate circuit includes a second ground electrode, a ground via conductor, a third capacitor electrode, a fourth capacitor electrode, a second line electrode, a third via conductor, and a fourth via conductor.

The second line electrode extends in the vertical direction to the stacking direction of the dielectric layers. The third capacitor electrode and the fourth capacitor electrode are arranged to face the second ground electrode. The third via conductor passes through in the stacking direction and connects the second line electrode and the third capacitor electrode. The fourth via conductor passes through in the stacking direction and connects the second line electrode and the fourth capacitor electrode. The ground via conductor connects the first ground electrode and the second ground electrode. The first intermediate capacitor electrode faces the third capacitor electrode of the first intermediate circuit and the third capacitor electrode of the second intermediate circuit.

Band pass filters according to preferred embodiments of the present invention each enable an attenuation pole with a desired attenuation to be provided on at least one of a high frequency side and a low frequency side of a pass band while the pass band is maintained.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Features of the present invention will be described below in further detail by describing preferred embodiments of the present invention. A band pass filter according to a preferred embodiment of the present invention may be, for example, a multilayer ceramic filter formed by co-firing a low temperature fired ceramic, pattern conductors, and via conductors. However, band pass filters according to preferred embodiments of the present invention are not limited thereto.

A band pass filter according to a preferred embodiment of the present invention relates to formation of an attenuation pole on the high frequency side of a pass band and includes a capacitor that connects a first intermediate circuit and a second intermediate circuit, which will be described below.

First Example

A band pass filter 100 according to a first example of a preferred embodiment of the present invention is described with reference to FIG. 1 to FIG. 3.

Exploded perspective views, which will be described below, are schematic diagrams. For example, the thickness of a dielectric layer, the thickness of a pattern conductor, the diameter of a via conductor, and the like are schematically illustrated. Further, variations in the shape of each element, which occurs during the process of fabrication, and the like are not necessarily reflected in each drawing. Hereinafter, the drawings being used for the description in this specification show an actual product in essence, even if there are discrepancies with the actual product.

Figure 1:
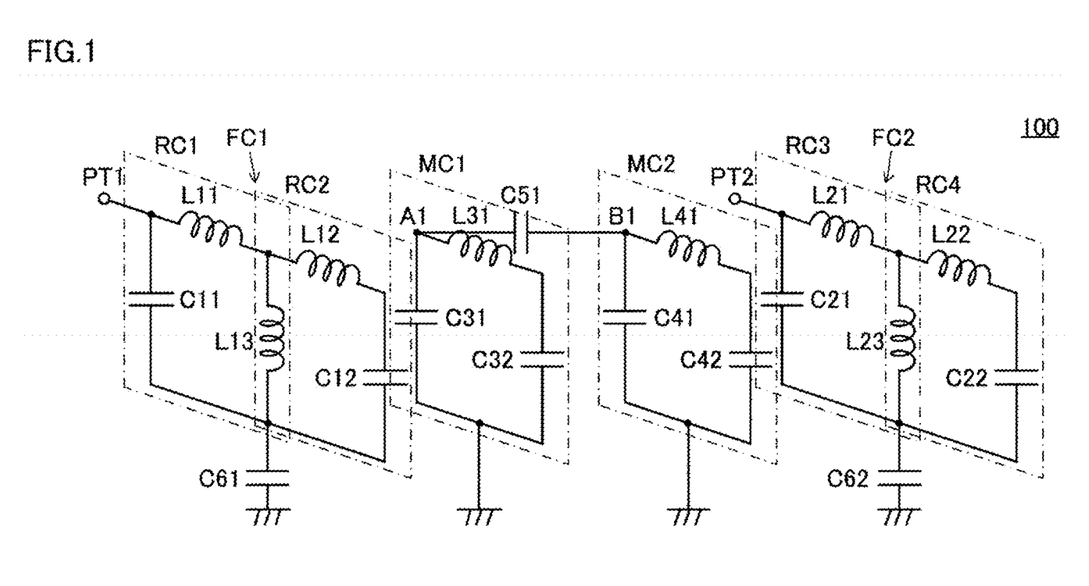
FIG. 1 is an equivalent circuit diagram of a band pass filter which is a first example of a preferred embodiment of the present invention.

FIG. 1 is an equivalent circuit diagram of the band pass filter 100. The band pass filter 100 includes a first filter circuit FC1, a second filter circuit FC2, a first intermediate circuit MC1, and a second intermediate circuit MC2.

The first filter circuit FC1 includes a first resonant circuit RC1, a second resonant circuit RC2, and a first common capacitor C61. The first resonant circuit RC1 includes a first inductor L11, a third inductor L13, and a first capacitor C11. The second resonant circuit RC2 includes a second inductor L12, the third inductor L13, and a second capacitor C12.

In the first resonant circuit RC1, the first inductor L11 and the third inductor L13, which are connected in series to each other, are connected in parallel to the first capacitor C11. In the second resonant circuit RC2, the second inductor L12 and the third inductor L13, which are connected in series to each other, are connected in parallel to the second capacitor C12. The third inductor L13 is an element common between the first resonant circuit RC1 and the second resonant circuit RC2.

The first filter circuit FC1 further includes a first port PT1 connected to a node between the first inductor L11 and the first capacitor C11. Further, in the first filter circuit FC1, a node between the first capacitor C11, the second capacitor C12, and the third inductor L13 is grounded via the first common capacitor C61.

The second filter circuit FC2 includes a third resonant circuit RC3, a fourth resonant circuit RC4, and a second common capacitor C62. The third resonant circuit RC3 includes a fourth inductor L21, a sixth inductor L23, and a third capacitor C21. The fourth resonant circuit RC4 includes a fifth inductor L22, the sixth inductor L23, and a fourth capacitor C22.

In the third resonant circuit RC3, the fourth inductor L21 and the sixth inductor L23, which are connected in series to each other, are connected in parallel to the third capacitor C21. In the fourth resonant circuit RC4, the fifth inductor L22 and the sixth inductor L23, which are connected in series to each other, are connected in parallel to the fourth capacitor C22. The sixth inductor L23 is an element common between the third resonant circuit RC3 and the fourth resonant circuit RC4.

The second filter circuit FC2 further includes a second port PT2 connected to a node between the fourth inductor L21 and the third capacitor C21. Further, in the second filter circuit FC2, a node between the third capacitor C21, the fourth capacitor C22, and the sixth inductor L23 is grounded via the second common capacitor C62.

The first intermediate circuit MC1 includes a fifth capacitor C31, a sixth capacitor C32, and a seventh inductor L31. Each of the fifth capacitor C31 and the sixth capacitor C32 is connected to ground. The seventh inductor L31 is connected between the fifth capacitor C31 and the sixth capacitor C32. That is, one of capacitor electrodes of the fifth capacitor C31 is connected to the ground, and the other of the capacitor electrodes is connected to one end portion of the seventh inductor L31. Further, one of capacitor electrodes of the sixth capacitor C32 is connected to the ground, and the other of the capacitor electrodes is connected to the other end portion of the seventh inductor L31. The first intermediate circuit MC1 defines and functions as a resonant circuit. That is, the first intermediate circuit MC1 defines and functions as a resonant circuit in a center stage of the band pass filter 100.

The second intermediate circuit MC2 includes a seventh capacitor C41, an eighth capacitor C42, and an eighth inductor L41. Each of the seventh capacitor C41 and the eighth capacitor C42 is connected to the ground. The eighth inductor L41 is connected between the seventh capacitor C41 and the eighth capacitor C42. That is, one of capacitor electrodes of the seventh capacitor C41 is connected to the ground, and the other of the capacitor electrodes is connected to one end portion of the eighth inductor L41. Further, one of capacitor electrodes of the eighth capacitor C42 is connected to the ground, and the other of the capacitor electrodes is connected to the other end portion of the eighth inductor L41. The second intermediate circuit MC2 defines and functions as a resonant circuit. That is, the second intermediate circuit MC2 defines and functions as a resonant circuit in the center stage of the band pass filter 100.

The seventh inductor L31 is electromagnetically coupled with each of the first inductor L11, the second inductor L12, and the third inductor L13. The eighth inductor L41 is electromagnetically coupled with each of the fourth inductor L21, the fifth inductor L22, and the sixth inductor L23. And, the seventh inductor L31 and the eighth inductor L41 are also electromagnetically coupled with each other.

Further, the band pass filter 100 further includes a ninth capacitor C51. The ninth capacitor C51 is connected between a node A1 between the fifth capacitor C31 and the seventh inductor L31 and a node B1 between the seventh capacitor C41 and the eighth inductor L41.

Figure 2:
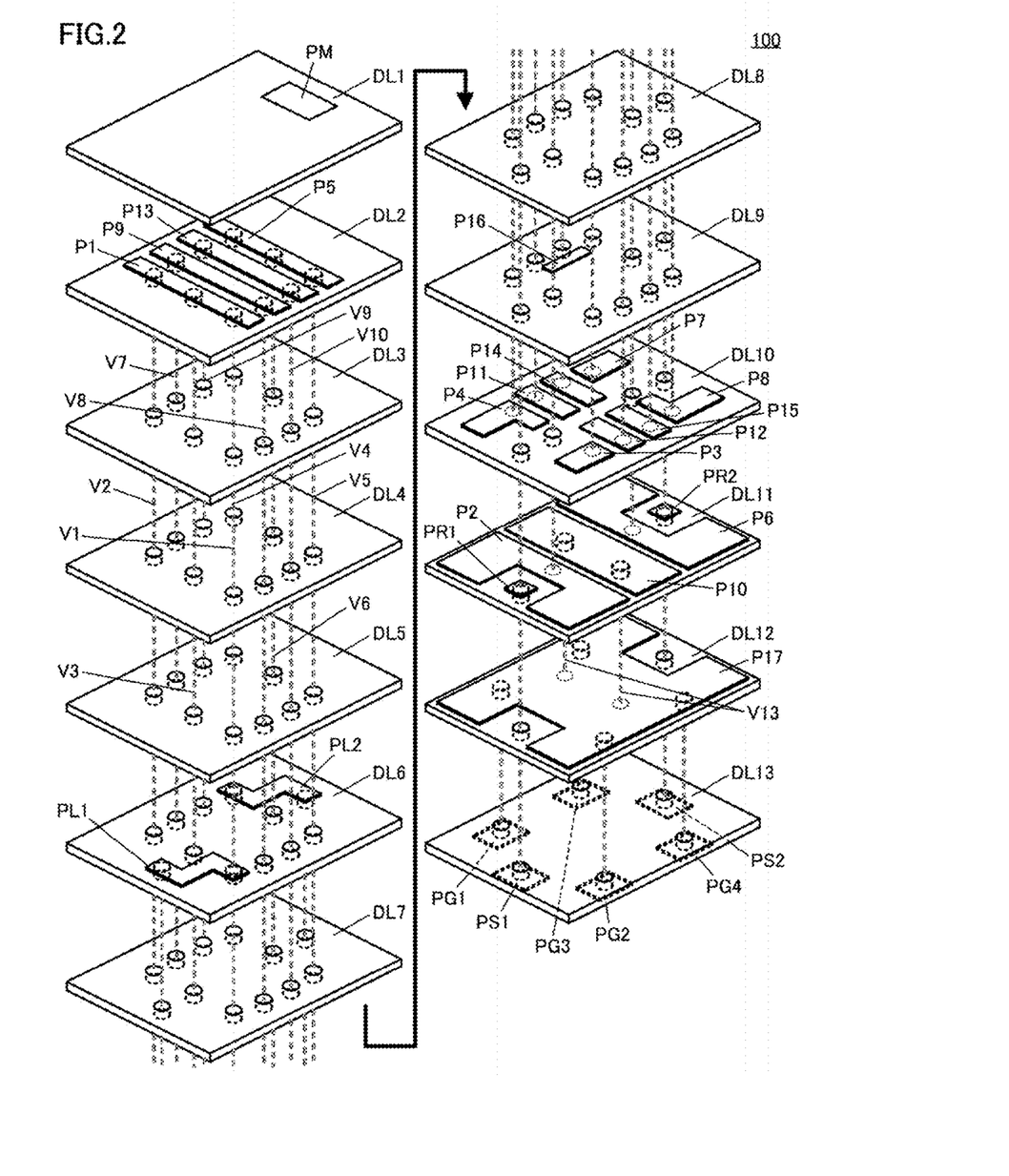
FIG. 2 is an exploded perspective view of the band pass filter of FIG. 1.

FIG. 2 is an exploded perspective view of the band pass filter 100. The band pass filter 100 includes dielectric layers DL1 to DL13 which are stacked on top of each other, the first filter circuit, the second filter circuit, the first intermediate circuit, the second intermediate circuit, and a first intermediate capacitor electrode P16 having a rectangular or substantially rectangular shape. In FIG. 2, a direction mark PM is provided on the dielectric layer DL1, but this is not required (the same applies hereinafter).

The first filter circuit and the second filter circuit are aligned in a direction orthogonal or substantially orthogonal to a stacking direction of the dielectric layers DL1 to DL13. The first intermediate circuit and the second intermediate circuit are in between the first filter circuit and the second filter circuit. Further, the first intermediate circuit is electromagnetically coupled with the first filter circuit. The second intermediate circuit is electromagnetically coupled with each of the second filter circuit and the first intermediate circuit.

The first filter circuit includes a first line electrode P1, a common electrode P2, a first capacitor electrode P3, a second capacitor electrode P4, a first via conductor V1, a second via conductor V2, and a common via conductor V3. The first line electrode P1 and the first capacitor electrode P3 each have a rectangular or substantially rectangular shape, the common electrode P2 has an angular C shape, and the second capacitor electrode P4 has an L shape, for example. However, the shape of each electrode is not limited thereto. For example, the common electrode P2 may be divided into a first portion and a second portion.

The first line electrode P1 is provided on the dielectric layer DL2. That is, the first line electrode P1 extends in a vertical direction to the stacking direction of the dielectric layers DL1 to DL13. When seen from the stacking direction, the first capacitor electrode P3 and the second capacitor electrode P4 face the common electrode P2 with the dielectric layer DL10 interposed therebetween such that at least a portion of each of the first capacitor electrode P3 and the second capacitor electrode P4 overlaps with the common electrode P2.

That is, the first capacitor C11 includes the first capacitor electrode P3 and the common electrode P2. The second capacitor C12 includes the second capacitor electrode P4 and the common electrode P2. In the case where the common electrode P2 is divided into a first portion and a second portion, the first capacitor C11 may include the first portion, and the second capacitor C12 may include the second portion.

The first via conductor V1 penetrates through from the dielectric layer DL2 to the dielectric layer DL9 and connects the first line electrode P1 and the first capacitor electrode P3. The second via conductor V2 penetrates through from the dielectric layer DL2 to the dielectric layer DL9 and connects the first line electrode P1 and the second capacitor electrode P4. Further, the common via conductor V3 is between the first via conductor V1 and the second via conductor V2, penetrates through the dielectric layer DL2 to the dielectric layer DL10, and connects the first line electrode P1 and the common electrode P2.

Specifically, when a surface on the lower side of each electrode in FIG. 2 is defined as one principal surface and a surface on the upper side of each electrode in FIG. 2 is defined as the other principal surface, the first via conductor V1 is connected to the one principal surface of the first line electrode P1 at one end portion and is connected to the other principal surface of the first capacitor electrode P3 at the other end portion. The second via conductor V2 is connected to the one principal surface of the first line electrode P1 at one end portion and is connected to the other principal surface of the second capacitor electrode P4 at the other end portion. Further, the common via conductor V3 is connected to the one principal surface of the first line electrode P1 at one end portion and is connected to the other principal surface of the common electrode P2 at the other end portion.

That is, the first inductor L11 includes the first via conductor V1. The second inductor L12 includes the second via conductor V2. The third inductor L13 includes the common via conductor V3.

An extended electrode PL1 is connected to the first via conductor V1. Specifically, the extended electrode PL1 connects the first via conductor V1, which is provided in an outer periphery part of the dielectric layer, to a signal electrode PS1, which is provided in a dielectric center portion. In the band pass filter 100, the extended electrode PL1 has an angular S shape, for example, but the shape of the extended electrode PL1 is not limited thereto. A connecting location between the first via conductor V1 and the extended electrode PL1 is determined according to an inductance design of the first inductor L11 described above. The extended electrode PL1 is connected to the signal electrode PS1 which is provided on an outer surface (lower side in the drawing) of the dielectric layer DL13.

The second filter circuit includes a first line electrode P5, a common electrode P6, a first capacitor electrode P7, a second capacitor electrode P8, a first via conductor V4, a second via conductor V5, and a common via conductor V6. The first line electrode P5 and the first capacitor electrode P7 each have a rectangular or substantially rectangular shape, the common electrode P6 has an angular C shape, and the second capacitor electrode P8 has an L shape, for example. However, the shape of each electrode is not limited thereto. For example, the common electrode P6 may be divided into a first a portion and a second portion.

The first line electrode P5 is provided on the dielectric layer DL2. That is, the first line electrode P5 extends in the vertical direction to the stacking direction of the dielectric layers DL1 to DL13. When seen from the stacking direction, the first capacitor electrode P7 and the second capacitor electrode P8 faces the common electrode P2 with the dielectric layer DL10 interposed therebetween such that at least a portion of each of the first capacitor electrode P7 and the second capacitor electrode P8 overlaps with the common electrode P6.

That is, the third capacitor C21 includes the first capacitor electrode P7 and the common electrode P6. The fourth capacitor C2 includes the second capacitor electrode P8 and the common electrode P6. In the case where the common electrode P6 is divided into a first portion and a second portion, the third capacitor C21 may include the first portion, and the fourth capacitor C22 may include the second portion.

The first via conductor V4 penetrates through from the dielectric layer DL2 to the dielectric layer DL9 and connects the first line electrode P5 and the first capacitor electrode P7. The second via conductor V5 penetrates through from the dielectric layer DL2 to the dielectric layer DL9 and connects the first line electrode P5 and the second capacitor electrode P8. The common via conductor V6 is between the first via conductor V4 and the second via conductor V5, penetrates through the dielectric layer DL2 to the dielectric layer DL10, and connects the first line electrode P5 and the common electrode P6.

Specifically, the first via conductor V4 is connected to the one principal surface of the first line electrode P5 at one end portion and is connected to the other principal surface of the first capacitor electrode P7 at the other end portion. The second via conductor V5 is connected to the one principal surface of the first line electrode P5 at one end portion and is connected to the other principal surface of the second capacitor electrode P8 at the other end portion. Further, the common via conductor V6 is connected to the one principal surface of the first line electrode P5 at one end portion and is connected to the other principal surface of the common electrode P6 at the other end portion.

That is, the fourth inductor L21 includes the first via conductor V4. The fifth inductor L22 includes the second via conductor V5. The sixth inductor L23 includes the common via conductor V6.

An extended electrode PL2 is connected to the first via conductor V4. Specifically, the extended electrode PL2 connects the first via conductor V4, which is provided in an outer periphery part on the opposite side to the outer periphery portion of the dielectric layer where the first via conductor V1 is provided, to a signal electrode PS2, which is provided in the dielectric center part. In the band pass filter 100, the extended electrode PL2 has an angular S shape, for example, but the shape of the extended electrode PL2 is not limited thereto. A connecting location between the first via conductor V4 and the extended electrode PL2 is determined according to an inductance design of the fourth inductor L21 described above. The extended electrode PL2 is connected to the signal electrode PS2 which is provided on an outer surface (lower side in the drawing) of the dielectric layer DL13.

The first intermediate circuit includes a second line electrode P9, a second ground electrode P10, a third capacitor electrode P11, a fourth capacitor electrode P12, a third via conductor V7, and a fourth via conductor V8. Each of the second line electrode P9, the second ground electrode P10, the third capacitor electrode P11, and the fourth capacitor electrode P12 has a rectangular or substantially rectangular shape, for example. However, the shape of each electrode is not limited thereto.

The second line electrode P9 is provided on the dielectric layer DL2. That is, the second line electrode P9 extends in the vertical direction to the stacking direction of the dielectric layers DL1 to DL13. When seen from the stacking direction, the third capacitor electrode P11 and the fourth capacitor electrode P12 face the second ground electrode P10 with the dielectric layer DL10 interposed therebetween such that at least a portion of each of the third capacitor electrode P11 and the fourth capacitor electrode P12 overlaps with the second ground electrode P10.

That is, the fifth capacitor C31 includes the third capacitor electrode P11 and the second ground electrode P10. The sixth capacitor C32 includes the fourth capacitor electrode P12 and the second ground electrode P10.

The third via conductor V7 penetrates through from the dielectric layer DL2 to the dielectric layer DL9 and connects the second line electrode P9 and the third capacitor electrode P11. The fourth via conductor V8 penetrates through from the dielectric layer DL2 to the dielectric layer DL9 and connects the second line electrode P9 and the fourth capacitor electrode P12. Specifically, the third via conductor V7 is connected to the one principal surface of the second line electrode P9 at one end portion and is connected to the other principal surface of the third capacitor electrode P11 at the other end portion. The fourth via conductor V8 is connected to the one principal surface of the second line electrode P9 at one end portion and is connected to the other principal surface of the fourth capacitor electrode P12 at the other end portion.

That is, the seventh inductor L31 includes the second line electrode P9, the third via conductor V7, and the fourth via conductor V8.

The second intermediate circuit includes a second line electrode P13, a second ground electrode P10, a third capacitor electrode P14, a fourth capacitor electrode P15, a third via conductor V9, and a fourth via conductor V10. The second ground electrode P10 is an element common between the first intermediate circuit and the second intermediate circuit. Each of the second line electrode P13, the third capacitor electrode P14, and the fourth capacitor electrode P15 has a rectangular or substantially rectangular shape, for example. However, the shape of each electrode is not limited thereto.

The second line electrode P13 is provided on the dielectric layer DL2. That is, the second line electrode P13 extends in the vertical direction to the stacking direction of the dielectric layers DL1 to DL13. When seen from the stacking direction, the third capacitor electrode P14 and the fourth capacitor electrode P15 face the second ground electrode P10 with the dielectric layer DL10 interposed therebetween such that at least a portion of each of the third capacitor electrode P14 and the fourth capacitor electrode P15 overlaps with the second ground electrode P10.

That is, the seventh capacitor C41 includes the third capacitor electrode P14 and the second ground electrode P10. The eighth capacitor C42 includes the fourth capacitor electrode P15 and the second ground electrode P10.

The third via conductor V9 penetrates through from the dielectric layer DL2 to the dielectric layer DL9 and connects the second line electrode P13 and the third capacitor electrode P14. The fourth via conductor V10 penetrates through from the dielectric layer DL2 to the dielectric layer DL9 and connects the second line electrode P13 and the fourth capacitor electrode P15. Specifically, the third via conductor V9 is connected to the one principal surface of the second line electrode P13 at one end portion and is connected to the other principal surface of the third capacitor electrode P14 at the other end portion. The fourth via conductor V10 is connected to the one principal surface of the second line electrode P13 at one end portion and is connected to the other principal surface of the fourth capacitor electrode P15 at the other end portion.

That is, the eighth inductor L41 includes the second line electrode P13, the third via conductor V9, and the fourth via conductor V10.

Further, the first intermediate capacitor electrode P16 faces the third capacitor electrode P11 of the first intermediate circuit and the third capacitor electrode P14 of the second intermediate circuit with the dielectric layer DL9 interposed therebetween. Specifically, the one principal surface of the first intermediate capacitor electrode P16 faces the other principal surface of the third capacitor electrode P11 of the first intermediate circuit with the dielectric layer DL9 interposed therebetween. Further, the one principal surface of the first intermediate capacitor electrode P16 faces the other principal surface of the third capacitor electrode P14 of the second intermediate circuit with the dielectric layer DL9 interposed therebetween.

The second ground electrode P10 may be divided into a plurality of portions. In that case, the fifth capacitor C31, the sixth capacitor C32, the seventh capacitor C41, and the eighth capacitor C42, which are described above, may include the respective divided portions of the second ground electrode P10.

Figure 3:
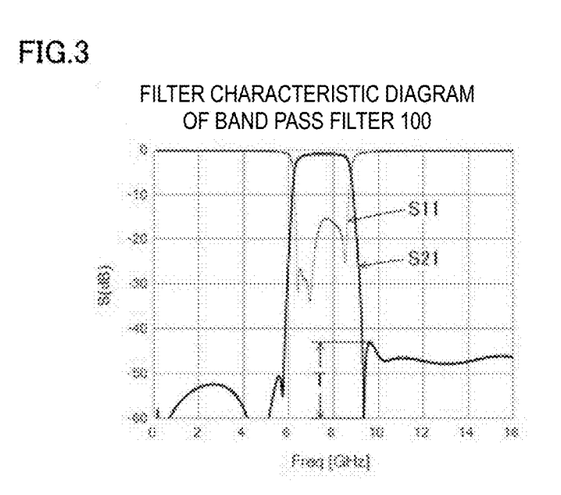
FIG. 3 is a filter characteristic diagram of the band pass filter of FIG. 1.

FIG. 3 illustrates filter characteristics of the band pass filter 100 in which the capacitance of each capacitor and the inductance of each inductor are set to respective predetermined values. Focusing on S21 of the filter characteristics, in the case where a pass band is defined by the frequencies where the insertion loss decreases by about 3 dB from a flat portion, in the band pass filter 100, the frequency range from, for example, about 6.3 GHz to about 8.7 GHz is the pass band. Further, there is an attenuation pole that causes a steep attenuation at, for example, about −55 dB at about 5.7 GHz on the low frequency side of the pass band, and there is an attenuation pole that causes a steep attenuation at, for example, about −60 dB at about 9.4 GHz on the high frequency side of the pass band. The reason there is the attenuation on the high frequency side is that the propagation of a signal via the ground is minimized because the band pass filter 100 has the structure that the intermediate circuit whose ground is different from those of the first filter circuit and the second filter circuit is arranged in between the first filter circuit and the second filter circuit. Moreover, the first intermediate capacitor electrode P16 enables a larger attenuation pole to be set at a desired frequency.

Second Example

Figure 4:
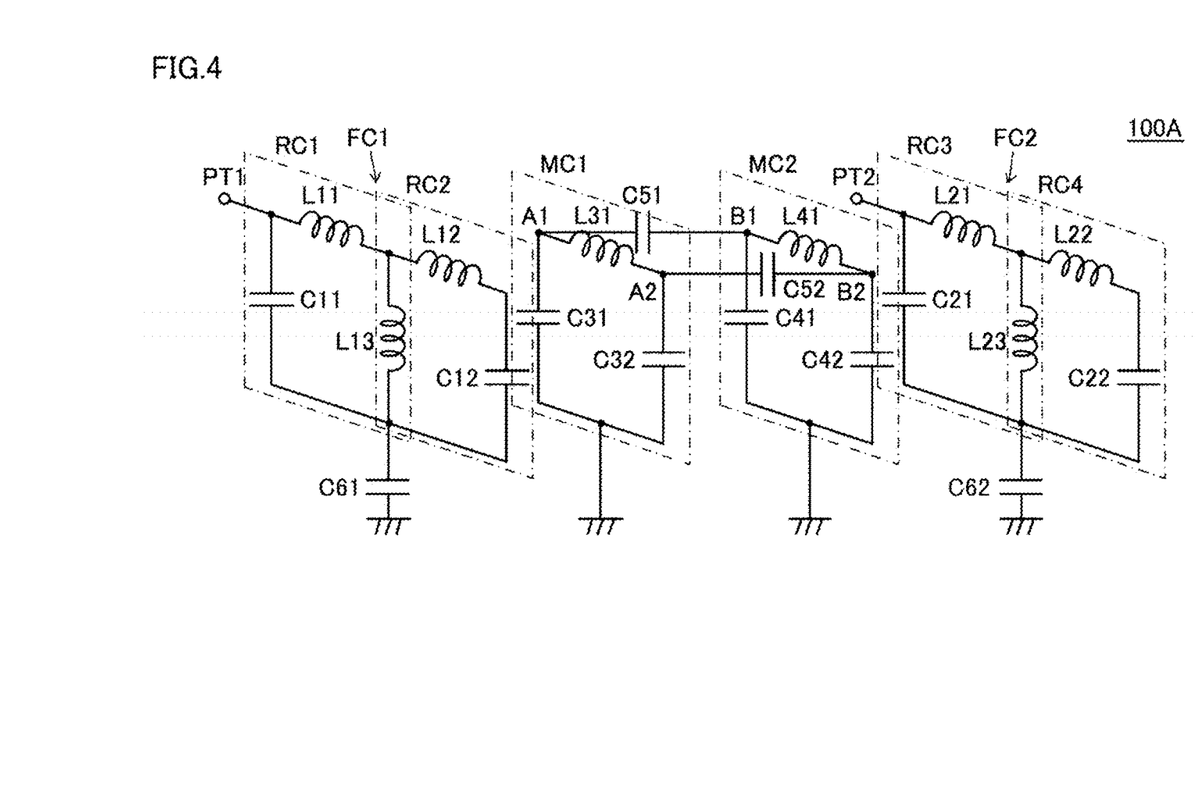
FIG. 4 is an equivalent circuit diagram of a band pass filter which is a second example of a preferred embodiment of the present invention.
Figure 5:
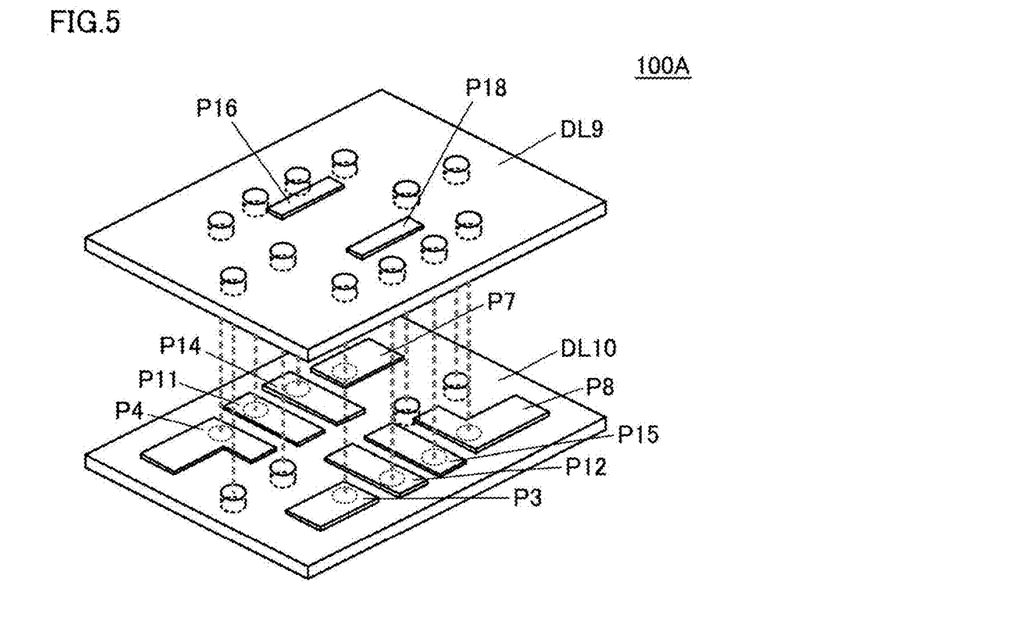
FIG. 5 is an exploded perspective view of a portion of the band pass filter of FIG. 4.
Figure 6:
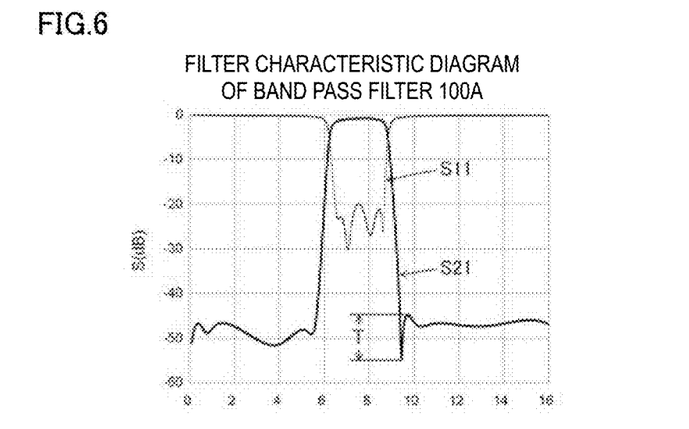
FIG. 6 is a filter characteristic diagram of the band pass filter of FIG. 4.

A band pass filter 100A according to a second example of a preferred embodiment of the present invention is described using FIG. 4 to FIG. 6.

FIG. 4 is an equivalent circuit diagram of the band pass filter 100A. The band pass filter 100A further includes a tenth capacitor C52. In the band pass filter 100A, the ninth capacitor C51 is connected between the node A1 and the node B1, which are described above. Further, the tenth capacitor C52 is connected between a node A2, which is between the sixth capacitor C32 and the seventh inductor L31, and the node B2 described above. Elements other than the above are the same or substantially the same as those of the band pass filter 100.

FIG. 5 is an exploded perspective view of a portion of the band pass filter 100A. Specifically, FIG. 5 illustrates the dielectric layers DL9 and DL10, the first capacitor electrodes P3 and P7, the second capacitor electrodes P4 and P8, the third capacitor electrodes P11 and P14, the fourth capacitor electrodes P12 and P15, the first intermediate capacitor electrode P16, and a second intermediate capacitor electrode P18. That is, the band pass filter 100A further includes the second intermediate capacitor electrode P18 having a rectangular or substantially rectangular shape, for example. However, the shape of the second intermediate capacitor electrode P18 is not limited thereto. In the band pass filter 100A, the first intermediate capacitor electrode P16 is arranged in the same or substantially the same way as in the band pass filter 100.

Further, the second intermediate capacitor electrode P18 faces the fourth capacitor electrode P12 of the first intermediate circuit and the fourth capacitor electrode P15 of the second intermediate circuit with the dielectric layer DL9 interposed therebetween. Specifically, the one principal surface of the second intermediate capacitor electrode P18 faces the other principal surface of the fourth capacitor electrode P12 of the first intermediate circuit with the dielectric layer DL9 interposed therebetween. Further, the one principal surface of the second intermediate capacitor electrode P18 faces the other principal surface of the fourth capacitor electrode P15 of the second intermediate circuit with the dielectric layer DL9 interposed therebetween. Elements other than the above are the same or substantially the same as those of the band pass filter 100.

FIG. 6 illustrates filter characteristics of the band pass filter 100A in which the capacitance of each capacitor and the inductance of each inductor are set to respective predetermined values. Focusing on S21 of the filter characteristics, a pass band of the band pass filter 100A is from, for example, about 6.3 GHz to about 8.7 GHz and has not changed substantially from the pass band of the band pass filter 100. Further, there is an attenuation pole that causes a steep attenuation at, for example, about −50 dB at about 5.7 GHz on the low frequency side of the pass band, and there is an attenuation pole that causes a steep attenuation at, for example, about −55 dB at about 9.4 GHz on the high frequency side of the pass band.

From the first example and the second example described above, the band pass filters according to preferred embodiments of the present enable an attenuation pole with a desired attenuation to be provided on the high frequency side of a pass band while the pass band is maintained.

Further, as in the second example, where the ninth capacitor C51 and the tenth capacitor C52 are included, it is possible to reduce T that is a degree of decrease in the attenuation on a still higher frequency side relative to the attenuation at the attenuation pole on the high frequency side and increase the attenuation on the high frequency side of the pass band frequencies (see FIG. 3 and FIG. 6).

Each of the band pass filters 100 and 100A further includes a first ground electrode P17 and ground via conductors V13. Further, the common electrode P2 and the second ground electrode P10 are arranged to be spaced apart from each other. The first ground electrode P17 is connected to outer ground electrodes PG1 to PG4.

Further, the common electrode P2 in the first filter circuit FC1 and the first ground electrode P17 are arranged such that at least a portion of one of the electrodes faces at least a portion of the other of the electrodes. The common electrode P2 and the first ground electrode P17 define the first common capacitor C61. By grounding the first resonant circuit RC1 and the second resonant circuit RC2 via the first common capacitor C61, also when a DC component signal is input to the first port PT1, it is possible to reduce or prevent the flow of the DC component signal into the first filter circuit FC1.

Similarly, the common electrode P6 in the second filter circuit FC2 and the first ground electrode P17 are arranged such that at least a portion of one of the electrodes faces at least a portion of the other of the electrodes. The common electrode P6 and the first ground electrode P17 define the second common capacitor C62. By grounding the third resonant circuit RC3 and the fourth resonant circuit RC4 via the second common capacitor C62, also when a DC component signal is input to the second port PT2, it is possible to suppress the flow of the DC component signal into the second filter circuit FC12.

That is, the first common capacitor C61 and the second common capacitor C62 each define and function as a DC-cut filter. It is not necessary to include both of the first common capacitor C61 and the second common capacitor C62, and the configuration may be such that depending on needs, at least one of the capacitors is included.

The second ground electrode P10 in the first intermediate circuit MC1 and the second intermediate circuit MC2 and the first ground electrode P17 are connected to each other using the ground via conductors V13. FIG. 2 illustrates the configuration in which a plurality of ground via conductors V13 are provided. However, one ground via conductor V13 may alternatively be provided.

The configurations described above enable the independent adjustment of the inductance between the first filter circuit and the ground. Similarly, it is possible to independently adjust the inductance between the ground and the second filter circuit and the inductance between the ground and the first and second intermediate circuits.

The preferred embodiments described in this specification are for illustrative purpose and the present invention is not limited to the preferred embodiments described above and their modified examples, and various modifications and changes may be made within the scope of this invention.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A band pass filter comprising:
a first filter circuit including a first resonant circuit, a second resonant circuit, and a first common capacitor, the first resonant circuit including a first inductor, a third inductor, and a first capacitor, the second resonant circuit including a second inductor, the third inductor, and a second capacitor;
a second filter circuit including a third resonant circuit, a fourth resonant circuit, and a second common capacitor, the third resonant circuit including a fourth inductor, a sixth inductor, and a third capacitor, the fourth resonant circuit including a fifth inductor, the sixth inductor, and a fourth capacitor;
a first intermediate circuit including a fifth capacitor connected to ground, a sixth capacitor connected to the ground, and a seventh inductor connected between the fifth capacitor and the sixth capacitor;
a second intermediate circuit including a seventh capacitor connected to the ground, an eighth capacitor connected to the ground, and an eighth inductor connected between the seventh capacitor and the eighth capacitor; and
a ninth capacitor; wherein
the first resonant circuit and the second resonant circuit are connected to the ground via the first common capacitor;
the third resonant circuit and the fourth resonant circuit are connected to the ground via the second common capacitor;
the seventh inductor is electromagnetically coupled with each of the first, second, and third inductors, and the eighth inductor is electromagnetically coupled with each of the fourth, fifth, sixth, and seventh inductors; and
the ninth capacitor is connected between the first intermediate circuit and the second intermediate circuit.

2. The band pass filter according to claim 1, wherein the ninth capacitor is connected between a node between the fifth capacitor and the seventh inductor and a node between the seventh capacitor and the eighth inductor.

3. The band pass filter according to claim 2, further comprising:
a tenth capacitor; wherein
the tenth capacitor is connected between a node between the sixth capacitor and the seventh inductor and a node between the eighth capacitor and the eighth inductor.

4. The band pass filter according to claim 1, wherein each of the first filter circuit, the second filter circuit, the first intermediate circuit, and the second intermediate circuit has a rectangular or substantially rectangular shape.

5. The band pass filter according to claim 1, wherein the band pass filter has a pass band of about 6.3 GHz to about 8.7 GHz.

6. A band pass filter comprising:
a plurality of dielectric layers stacked on top of one another;
a first filter circuit and a second filter circuit aligned in a direction orthogonal or substantially orthogonal to a stacking direction of the plurality of dielectric layers;
a first intermediate circuit and a second intermediate circuit between the first filter circuit and the second filter circuit, the first intermediate circuit being electromagnetically coupled with the first filter circuit, the second intermediate circuit being electromagnetically coupled with each of the second filter circuit and the first intermediate circuit;
a first ground electrode; and
a first intermediate capacitor electrode; wherein
each of the first filter circuit and the second filter circuit includes:
a first line electrode extending in a vertical direction to the stacking direction;
a common electrode facing the first ground electrode;
a first capacitor electrode facing the common electrode;
a second capacitor electrode facing the common electrode;
a first via conductor passing through in the stacking direction and connects the first line electrode and the first capacitor electrode;
a second via conductor extending through in the stacking direction and connects the first line electrode and the second capacitor electrode; and
a common via conductor between the first via conductor and the second via conductor, extending through in the stacking direction, and connecting the first line electrode and the common electrode;

each of the first intermediate circuit and the second intermediate circuit includes:
- a second line electrode extending in the vertical direction;
- a second ground electrode;
- a ground via conductor connecting the first ground electrode and the second ground electrode;
- a third capacitor electrode facing the second ground electrode;
- a fourth capacitor electrode facing the second ground electrode;
- a third via conductor extending through in the stacking direction and connecting the second line electrode and the third capacitor electrode; and
- a fourth via conductor extending through in the stacking direction and connecting the second line electrode and the fourth capacitor electrode; and the first intermediate capacitor electrode faces the third capacitor electrode of the first intermediate circuit and the third capacitor electrode of the second intermediate circuit.

7. The band pass filter according to claim 6, further comprising:
a second intermediate capacitor electrode; wherein the second intermediate capacitor electrode faces the fourth capacitor electrode of the first intermediate circuit and the fourth capacitor electrode of the second intermediate circuit.

8. The band pass filter according to claim 6, wherein each of the first filter circuit, the second filter circuit, the first intermediate circuit, and the second intermediate circuit has a rectangular or substantially rectangular shape.

9. The band pass filter according to claim 6, wherein the common electrode has an angular C shape.

10. The band pass filter according to claim 6, wherein the second capacitor electrode has an L shape.

11. The band pass filter according to claim 6, further comprising:
an extended electrode connected to the first via conductor; wherein
the extended electrode connects the first via conductor to a signal electrode.

12. The band pass filter according to claim 11, wherein the extended electrode has an angular S shape.

13. The band pass filter according to claim 6, wherein the common electrode and the second ground electrode are spaced apart from one another.

14. The band pass filter according to claim 6, wherein the band pass filter has a pass band of about 6.3 GHz to about 8.7 GHz.

* * * * *